United States Patent
Im et al.

(10) Patent No.: US 12,408,386 B2
(45) Date of Patent: Sep. 2, 2025

(54) THIN FILM TRANSISTOR ARRAY SUBSTRATE INCLUDING AN ACTIVE LAYER HAVING TWO DIFFERENT CHANNEL AREAS AND ELECTRONIC DEVICE INCLUDING THE SAME

(71) Applicant: LG Display Co., Ltd., Seoul (KR)

(72) Inventors: Seoyeon Im, Paju-si (KR); Sungju Choi, Seoul (KR); JungSeok Seo, Daejeon (KR); Jaeyoon Park, Paju-si (KR); Jinwon Jung, Seoul (KR)

(73) Assignee: LG Display Co., Ltd., Seoul (KR)

( * ) Notice: Subject to any disclaimer, the term of this patent is extended or adjusted under 35 U.S.C. 154(b) by 466 days.

(21) Appl. No.: 17/985,634

(22) Filed: Nov. 11, 2022

(65) Prior Publication Data

US 2023/0215955 A1 Jul. 6, 2023

(30) Foreign Application Priority Data

Dec. 31, 2021 (KR) .......................... 10-2021-0194693

(51) Int. Cl.
*H10D 30/67* (2025.01)
*H10D 86/40* (2025.01)
(Continued)

(52) U.S. Cl.
CPC ....... *H10D 30/6757* (2025.01); *H10D 30/673* (2025.01); *H10D 30/6755* (2025.01);
(Continued)

(58) Field of Classification Search
CPC ......... H10D 30/501–509; H10D 30/67; H10D 30/6704; H10D 30/6715; H10D 30/6728; H10D 30/6729; H10D 30/673; H10D 30/674; H10D 30/6755; H10D 30/6757; H10D 30/6758; H10D 62/235; H10D 84/40; H10D 84/421; H10D 84/471;
(Continued)

(56) References Cited

U.S. PATENT DOCUMENTS 9,831,309 B2 11/2017 Miyairi
2007/0254402 A1 11/2007 Dimmler et al.
(Continued)

FOREIGN PATENT DOCUMENTS

EP 0365755 A1 5/1990
JP 2012017843 A 1/2012
(Continued)

*Primary Examiner* — Cheung Lee
(74) *Attorney, Agent, or Firm* — Seed IP Law Group LLP

(57) ABSTRACT

A thin film transistor array substrate includes a first electrode, a first insulation film including a hole exposing a portion of an upper surface of the first electrode, an active layer contacting a portion of an upper surface of the first insulation film and the portion of the upper surface of the first electrode, a second insulation film disposed on the active layer, a gate electrode disposed on the second insulation film, a third insulation film disposed on the gate electrode, and a second electrode and a third electrode disposed on the third insulation film, and electrically connected with the active layer, wherein the active layer includes a first channel area and a second channel area spaced apart from each other, and wherein the first channel area and the second channel area include an area positioned on a side surface of the hole of the first insulation film.

30 Claims, 16 Drawing Sheets

(51) Int. Cl.
*H10D 86/60* (2025.01)
*H10K 59/121* (2023.01)

(52) U.S. Cl.
CPC ............. *H10D 86/40* (2025.01); *H10D 86/60* (2025.01); *H10K 59/1213* (2023.02)

(58) Field of Classification Search
CPC .. H10D 84/60; H10K 59/1213; H10K 59/123; G02F 1/13306; G02F 1/134309; G02F 1/136227
See application file for complete search history.

(56) References Cited

U.S. PATENT DOCUMENTS

| | | |
|---|---|---|
| 2016/0300899 A1 | 10/2016 | Zhang |
| 2020/0119154 A1 | 4/2020 | Cao et al. |

FOREIGN PATENT DOCUMENTS

| | | |
|---|---|---|
| JP | 2016149552 A | 8/2016 |
| KR | 20210076695 A | 6/2021 |
| KR | 20210079701 A | 6/2021 |

THIN FILM TRANSISTOR ARRAY SUBSTRATE INCLUDING AN ACTIVE LAYER HAVING TWO DIFFERENT CHANNEL AREAS AND ELECTRONIC DEVICE INCLUDING THE SAME

CROSS-REFERENCE TO RELATED APPLICATION

This application claims priority from Korean Patent Application No. 10-2021-0194693, filed on Dec. 31, 2021, which is hereby incorporated by reference for all purposes as if fully set forth herein.

BACKGROUND

Technical Field

Embodiments of the disclosure relate to a thin film transistor array substrate and an electronic device including the same.

Description of the Related Art

The growth of the intelligent society leads to increased demand for various types of electronic devices, as for display devices or lighting devices. Such an electronic device may include a panel having data lines and gate lines, a data driver for driving the data lines, and a gate driver for driving the gate lines.

To drive a panel, which is a core component of such an electronic device, numerous transistors may be disposed with various functions.

Accordingly, the panel manufacturing process is inevitably complicated and difficult. Accordingly, if processing convenience is pursued, the device performance of the transistor may be degraded.

Further, to realize excellent characteristics, e.g., high resolution, in the electronic device, the transistor should be further integrated. However, since it is technically difficult to indefinitely reduce the area of the transistor due to process and design issues, it is beneficial to control the area occupied by the transistor without degrading the characteristics of the transistor.

BRIEF SUMMARY

Embodiments of the disclosure relate to a thin film transistor array substrate (or a thin film transistor assembly) including a vertical-structure transistor capable of implementing a short channel and integration and an electronic device including the same.

Embodiments of the disclosure also relate to a thin film transistor array substrate occupying a reduced area and enhanced current characteristics and an electronic device including the same.

Embodiments of the disclosure also relate to a thin film transistor array substrate including a vertical-structure transistor capable of element miniaturization and a short channel as well as improved processing convenience, and an electronic device including the same.

Embodiments of the disclosure may provide an electronic device including a display panel including at least one thin film transistor and a driving circuit for driving the panel. The panel may include a substrate, a first electrode disposed on the substrate, a first insulation film including a hole exposing a portion of an upper surface of the first electrode, an active layer contacting a portion of an upper surface of the first insulation film and a portion of an upper surface of the first electrode, a second insulation film disposed on the active layer, a gate electrode disposed on the second insulation film, a third insulation film disposed on the gate electrode, and a second electrode and a third electrode disposed on the third insulation film, spaced apart from each other, and electrically connected to the active layer. The active layer includes a first channel area and a second channel area spaced apart from each other, and the first channel area and the second channel area include an area positioned on a side surface of the hole of the first insulation film.

Embodiments of the disclosure may provide a thin film transistor array substrate comprising a substrate, a first electrode disposed on the substrate, a first insulation film including a hole exposing a portion of an upper surface of the first electrode, an active layer contacting a portion of an upper surface of the first insulation film and the portion of the upper surface of the first electrode, a second insulation film disposed on the active layer, a gate electrode disposed on the second insulation film, a third insulation film disposed on the gate electrode, and a second electrode and a third electrode disposed on the third insulation film, spaced apart from each other, and electrically connected to the active layer, wherein the active layer includes a first channel area and a second channel area spaced apart from each other, and wherein the first channel area and the second channel area include an area positioned on a side surface of the hole of the first insulation film.

According to embodiments of the disclosure, there may be provided a thin film transistor array substrate including a vertical-structure transistor capable of implementing a short channel and integration and an electronic device including the same.

According to embodiments of the disclosure, there may be provided a thin film transistor array substrate occupying a reduced area and enhanced current characteristics and an electronic device including the same.

According to embodiments of the disclosure, there may be provided a thin film transistor array substrate including a vertical-structure transistor capable of element miniaturization and a short channel as well as enhanced processing convenience, and an electronic device including the same.

DESCRIPTION OF THE SEVERAL VIEWS OF THE DRAWINGS

The above and other objects, features, and advantages of the present disclosure will be more clearly understood from the following detailed description, taken in conjunction with the accompanying drawings, in which.

DETAILED DESCRIPTION

Figure 1:
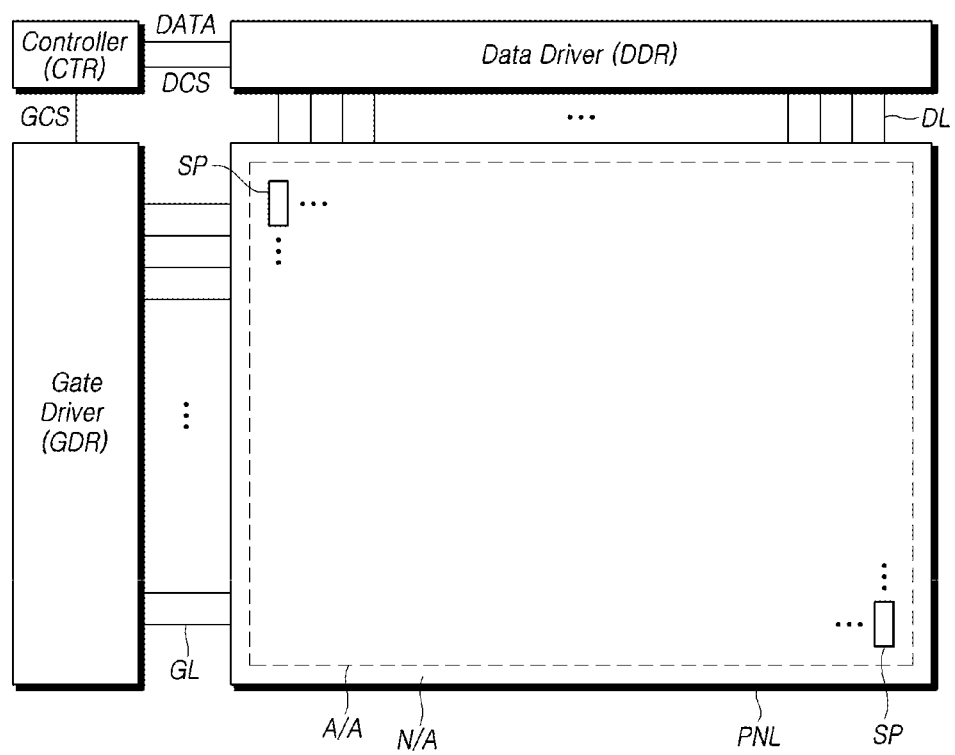
FIG. 1 is a view schematically illustrating a system configuration of an electronic device according to embodiments of the disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including," "having," "containing," "constituting" "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements, etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

The shapes, sizes, dimensions (e.g., length, width, height, thickness, radius, diameter, area, etc.), ratios, angles, number of elements, and the like illustrated in the accompanying drawings for describing the embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated.

In addition, when any dimensions, relative sizes, etc., are mentioned, it should be considered that numerical values for an elements or features, or corresponding information (e.g., level, range, etc.) include a tolerance or error range (e.g., about 5%-10%) that may be caused by various factors (e.g., process factors, internal or external impact, noise, etc.) even when a relevant description is not specified. Further, the term "may" fully encompasses all the meanings of the term "can".

Hereinafter, various embodiments of the disclosure are described in detail with reference to the accompanying drawings.

FIG. 1 is a view schematically illustrating a system configuration of an electronic device according to embodiments of the disclosure.

Electronic devices according to embodiments of the disclosure may include display devices, lighting devices, light emitting devices, and the like. For convenience of description, the following description focuses primarily on display devices. However, embodiments of the disclosure may also be applied to other various electronic devices, such as lighting devices or light emitting devices, as well as to display devices, as long as they include transistors.

According to embodiments of the disclosure, an electronic device may include a panel PNL for displaying images or outputting light and a driving circuit for driving the panel PNL.

The panel PNL may include a plurality of data lines DL, a plurality of gate lines GL, and a plurality of subpixels SP defined by the plurality of data lines DL and the plurality of gate lines GL and arranged in a matrix type.

In the panel PNL, the plurality of data lines DL and the plurality of gate lines GL may be disposed to cross each other. For example, the plurality of gate lines GL may be arranged in rows or columns, and the plurality of data lines DL may be arranged in columns or rows. For ease of description, it is assumed below that the plurality of gate lines GL are arranged in rows, and the plurality of data lines DL are arranged in columns.

The panel PNL may have other kinds of signal lines, as well as the plurality of data lines DL and the plurality of gate lines GL, depending on, e.g., the subpixel structure. The panel PNL may further have driving voltage lines, reference voltage lines, or common voltage lines.

The panel PNL may be various types of panels, such as a liquid crystal display (LCD) panel and an organic light emitting diode (OLED) panel.

The type of the signal lines disposed on the panel PNL may be varied depending on, e.g., the subpixel structure or panel type. In this disclosure, the concept of signal line may encompass signal-applied electrodes.

The panel PNL may include an active area A/A for displaying pictures or images and a non-active area N/A, in which no image is displayed, around the active area A/A. The non-active area N/A is also referred to as a bezel area.

The active area A/A includes a plurality of subpixels SP for displaying images.

The non-active area N/A has a pad portion for electrical connection with a data driver DDR and may have a plurality of data link lines to connect the pad portion with the plurality of data lines DL. The plurality of data link lines may be extensions of the plurality of data lines DL to the non-active area N/A or may be separate patterns electrically connected with the plurality of data lines DL.

The non-active area N/A may also include gate driving-related lines to transfer voltage (signals) necessary for gate driving to a gate driver GDR through pads electrically connected with the data driver DDR. For example, the gate driving-related lines may include clock lines for transferring clock signals, gate voltage lines for transferring gate voltages VGH and VGL, and gate driving control signal lines for transferring various control signals necessary to generate scan signals. The gate driving-related lines are disposed in the non-active area N/A, unlike the gate lines GL disposed in the active area A/A.

The driving circuit may include the data driver DDR for driving the plurality of data line DL, the gate driver GDR for driving the plurality of gate lines GL, and a controller CTR for controlling the data driver DDR and the gate driver GDR.

The data driver DDR may drive the plurality of data lines DL by outputting data voltage to the plurality of data lines DL.

The gate driver GDR may drive the plurality of gate lines GL by outputting scan signals to the plurality of gate lines GL.

The controller CTR may control the driving operation of the data driver Data driver DDR and gate driver GDR by supplying various control signals DCS and GCS necessary for the driving operation of the data driver DDR and gate driver GDR. Further, the controller CTR may supply image data DATA to the data driver DDR.

The controller CTR starts scanning according to a timing implemented in each frame, converts input image data input from the outside into image data DATA suited for the data signal format used in the data driver DDR, outputs the image data DATA, and controls data driving at an appropriate time suited for scanning.

To control the data driver DDR and gate driver GDR, the controller CTR receives timing signals, such as a vertical sync signal (Vsync), horizontal sync signal (Hsync), input data enable signal (Data Enable, DE), or clock signal CLK form the outside (e.g., a host system), generate various control signals, and outputs the control signals to the data driver DDR and gate driver GDR.

As an example, to control the gate driver GDR, the controller CTR outputs various gate control signals GCS including a gate start pulse (GSP), a gate shift clock (GSC), and a gate output enable signal (Gate Output Enable, GOE).

To control the data driver DDR, the controller CTR outputs various data control signals DCS including, e.g., a source start pulse (SSP), a source sampling clock (SSC), and a source output enable signal (Source Output Enable, SOE).

The controller CTR may be a timing controller used in typical display technology, or a control device that may perform other control functions as well as the functions of the timing controller.

The controller CTR may be implemented as a separate component from the data driver DDR, or the controller CTR, along with the data driver DDR, may be implemented as an integrated circuit.

The data driver DDR receives the image data DATA from the controller CTR and supply data voltage to the plurality of data lines DL, thereby driving the plurality of data lines DL. Here, the data driver DDR is also referred to as a source driver.

The data driver DDR may exchange various signals with the controller CTR via various interfaces.

The gate driver GDR sequentially drives the plurality of gate lines GL by sequentially supplying scan signals to the plurality of gate lines GL. Here, the gate driver GDR is also referred to as a scan driver.

The gate driver GDR sequentially supplies scan signals of On voltage or Off voltage to the plurality of gate lines GL under the control of the controller CTR.

When a specific gate line is opened by the gate driver GDR, the data driver DDR converts the image data DATA received from the controller CTR into an analog data voltage and supplies the analog data voltage to the plurality of data lines DL.

The data driver DDR may be positioned on only one side (e.g., the top or bottom side) of the panel PNL and, in some cases, the data driver DDR may be positioned on each of two opposite sides (e.g., both the top and bottom sides) of the panel PNL depending on, e.g., driving schemes or panel designs.

The gate driver GDR may be positioned on only one side (e.g., the left or right side) of the panel PNL and, in some cases, the gate driver GDR may be positioned on each of two opposite sides (e.g., both the left and right sides) of the panel PNL depending on, e.g., driving schemes or panel designs.

The data driver DDR may include one or more source driver integrated circuits (SDICs).

Each source driver integrated circuit (SDIC) may include a shift register, a latch circuit, a digital-to-analog converter (DAC), and an output buffer. In some cases, the data driver DDR may further include one or more analog-digital converters ADC.

Each source driver integrated circuit (SDIC) may be connected, in a tape automated bonding (TAB) type or chip-on-glass (COG) type, to the bonding pad of the panel PNL or may be disposed directly on the panel PNL. In some cases, each source driver integrated circuit (SDIC) may be integrated and disposed on the panel PNL. Each source driver integrated circuit (SDIC) may be implemented in a chip-on-film (COF) type. In this case, each source driver integrated circuit (SDIC) may be mounted on a circuit film and be electrically connected with the data lines DL of the panel PNL through the circuit film.

The gate driver GDR may include a plurality of gate driving circuits GDC. The plurality of gate driving circuits may respectively correspond to the plurality of gate lines GL.

Each gate driving circuit GDC may include, e.g., a shift register and a level shifter.

Each gate driving circuit GDC may be connected, in a tape automated bonding (TAB) type or chip-on-glass (COG) type, to the bonding pad of the panel PNL. Each gate driving circuit GDC may be implemented in a chip-on-film (COF) scheme. In this case, each gate driving circuit GDC may be mounted on a circuit film and be electrically connected with the gate lines GL of the panel PNL through the circuit film. Each gate driving circuit GDC may be implemented in a gate-in-panel (GIP) type and be embedded in the panel PNL. In other words, each gate driving circuit GDC may be formed directly on the panel PNL.

Figure 2A:
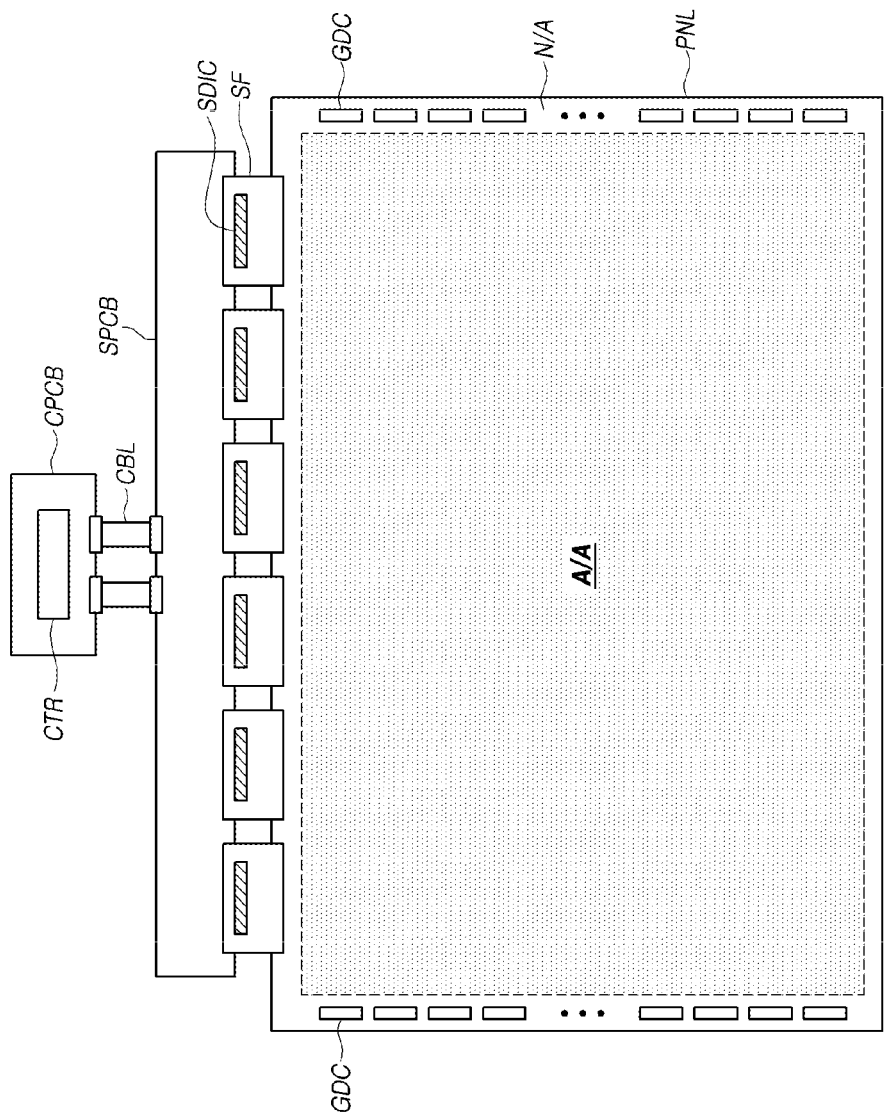
FIG. 2A is a view illustrating an example of systemic implementation of an electronic device according to embodiments of the disclosure.
Figure 2B:
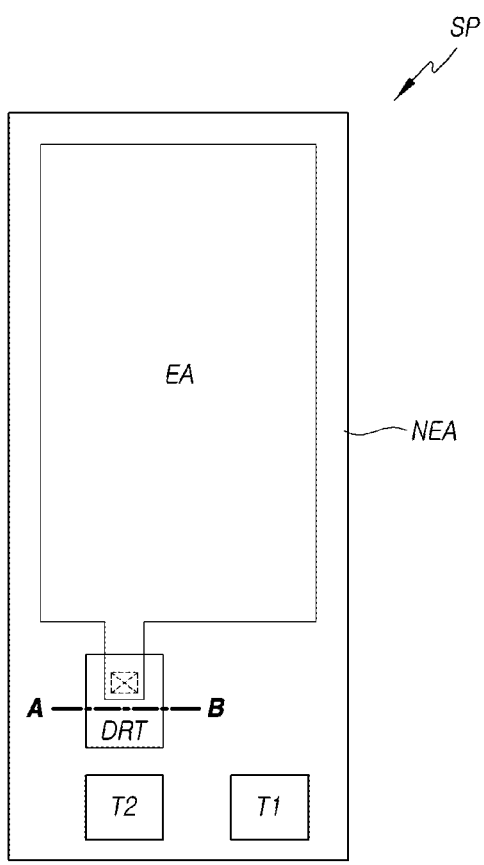
FIG. 2B is a view schematically illustrating a structure of a subpixel included in an active area when an electronic device is a display device according to embodiments of the disclosure.

FIG. 2A is a view illustrating an example of systemic implementation of an electronic device according to embodiments of the disclosure. FIG. 2B is a view schematically illustrating a structure of a subpixel included in an active area when an electronic device is a display device according to embodiments of the disclosure.

Referring to FIG. 2A, in the electronic device according to embodiments of the disclosure, the data driver DDR may be implemented in a chip on film (COF) type among various types (TAB, COG, COF, etc.), and the gate driver GDR may be implemented in a gate in panel (GIP) type among various types (TAB, COG, COF, GIP, etc.).

The data driver DDR may include one or more source driver integrated circuits SDIC. FIG. 2A illustrates an example in which the data driver DDR is implemented with a plurality of source driver integrated circuits SDIC.

When the data driver DDR is implemented in a COF type, each source driver integrated circuit SDIC implementing the data driver DDR may be mounted on the source-side circuit film SF.

One side of the source-side circuit film SF may be electrically connected to the pad portion (a collection of pads) present in the non-active area N/A of the panel PNL.

Lines for electrically connecting the source driver integrated circuit SDIC and the panel PNL may be disposed on the source-side circuit film SF.

The electronic device may include one or more source printed circuit boards SPCB for circuit connection between a plurality of source driver integrated circuits SDIC and other devices and a control printed circuit board CPCB for mounting control components and various electric devices.

The other side of the source-side circuit film SF on which the source driving integrated circuit SDIC is mounted may be connected to the one or more source printed circuit boards SPCB.

In other words, one side of the source-side circuit film SF on which the source driving integrated circuit SDIC is mounted may be electrically connected with the non-active area N/A of the panel PNL, and the other side thereof may be electrically connected with the source printed circuit board SPCB.

A controller CTR for controlling the operation of, e.g., the data driver DDR and the gate driver GDR may be disposed on the control printed circuit board CPCB.

Further, a power management integrated circuit PMIC for supplying various voltages or currents to, or controlling various voltages or currents to be supplied to, the panel PNL, the data driver DDR, and the gate driver GDR, may further be disposed on the control printed circuit board CPCB.

The source printed circuit board SPCB and the control printed circuit board CPCB may be circuit-connected through at least one connection member CBL. The connection member CBL may be, e.g., a flexible printed circuit (FPC) or a flexible flat cable (FFC).

One or more source printed circuit boards SPCB and control printed circuit board CPCB may be integrated into one printed circuit board.

When the gate driver GDR is implemented in a gate in panel (GIP) type, the plurality of gate driving circuits GDC included in the gate driver GDR may directly be formed on the non-active area N/A of the panel PNL.

Each of the plurality of gate driving circuits GDC may output a corresponding scan signal SCAN to a corresponding gate line GL disposed in the active area A/A in the panel PNL.

The plurality of gate driving circuits GDC disposed on the panel PNL may receive various signals (e.g., clock signal, high-level gate voltage (VGH), low-level gate voltage (VGL), start signal (VST), reset signal (RST), etc.) necessary to generate the scan signal through the gate driving-related lines disposed in the non-active area N/A.

The gate driving-related lines disposed in the non-active area N/A may be electrically connected with the source-side circuit film SF disposed most adjacent to the plurality of gate driving circuits GDC.

The plurality of subpixels SP may be disposed in the active area A/A. For example, the plurality of subpixels SP may include an emission area EA and a non-emission area NEA.

A plurality of transistors DRT, T1, and T2 may be included in the non-emission area NEA. The electrode overlapping the emission area EA may be electrically connected to at least one transistor DRT disposed in the non-emission area NEA.

This is discussed below in detail with reference to FIGS. 3 and 4.

Figure 3:
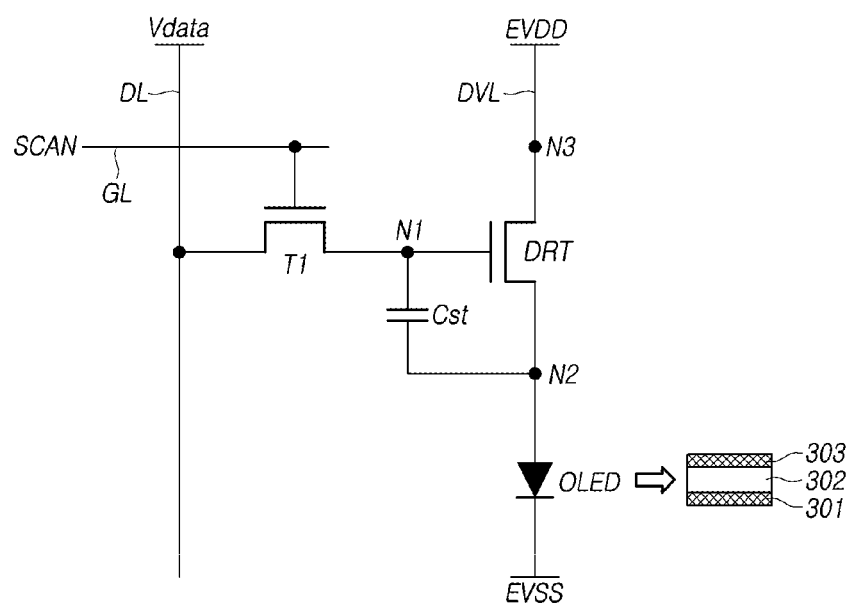
FIG. 3 is a view illustrating a structure of a subpixel SP when a panel PNL is an organic light emitting diode (OLED) panel according to embodiments of the disclosure.

FIG. 3 is a view illustrating a structure of a subpixel SP when a panel PNL is an organic light emitting diode (OLED) panel according to embodiments of the disclosure.

Referring to FIG. 3, each subpixel SP in the display panel PNL which is an OLED panel may further include a first transistor T1 to transfer data voltage Vdata to a first node N1, which corresponds to a gate node of the driving transistor DRT, and a storage capacitor Cst to maintain the data voltage Vdata corresponding to an image signal voltage or a voltage corresponding to the data voltage Vdata for the time of one frame.

The organic light emitting diode OLED may include a first electrode 301 (an anode electrode or cathode electrode), an organic layer 302 including at least one light emitting layer, and a second electrode 303 (a cathode electrode or anode electrode).

As an example, a base voltage EVSS may be applied to the second electrode 303 of the organic light emitting diode OLED.

The driving transistor DRT supplies a driving current to the organic light emitting diode OLED, thereby driving the organic light emitting diode OLED.

The driving transistor DRT includes the first node N1, second node N2, and third node N3.

The first node N1 of the driving transistor DRT is a node corresponding to the gate node and may be electrically connected with the source node or drain node of the first transistor T1.

The second node N2 of the driving transistor DRT may be electrically connected with the first electrode 301 of the organic light emitting diode OLED and may be the source node or drain node.

The third node N3 of the driving transistor DRT may be a node to which driving voltage EVDD is applied, be electrically connected with a driving voltage line DVL for supplying the driving voltage EVDD, and be the drain node or source node.

The driving transistor DRT and the first transistor T1 may be implemented as n-type transistors or p-type transistors.

The first transistor T1 may be electrically connected with the data line DL and the first node N1 of the driving transistor DRT and may receive, and be controlled by, a scan signal SCAN through the gate line and the gate node.

The first transistor T1 may be turned on by the scan signal SCAN, transferring the data voltage Vdata supplied from the data line DL to the first node N1 of the driving transistor DRT.

The storage capacitor Cst may be electrically connected between the first node N1 and second node N2 of the driving transistor DRT.

The storage capacitor Cst is an external capacitor intentionally designed to be outside the driving transistor DRT, but not a parasite capacitor (e.g., Cgs or Cgd) which is an internal capacitor present between the first node N1 and the second node N2 of the driving transistor DRT.

The structure of each subpixel exemplified in FIG. 3 is a 2T (transistor) 1C (capacitor) structure, which is merely an example for description, and may further include one or more transistors or, in some cases, one or more capacitors. The plurality of subpixels may have the same structure, or some of the plurality of subpixels may have a different structure.

Figure 4:
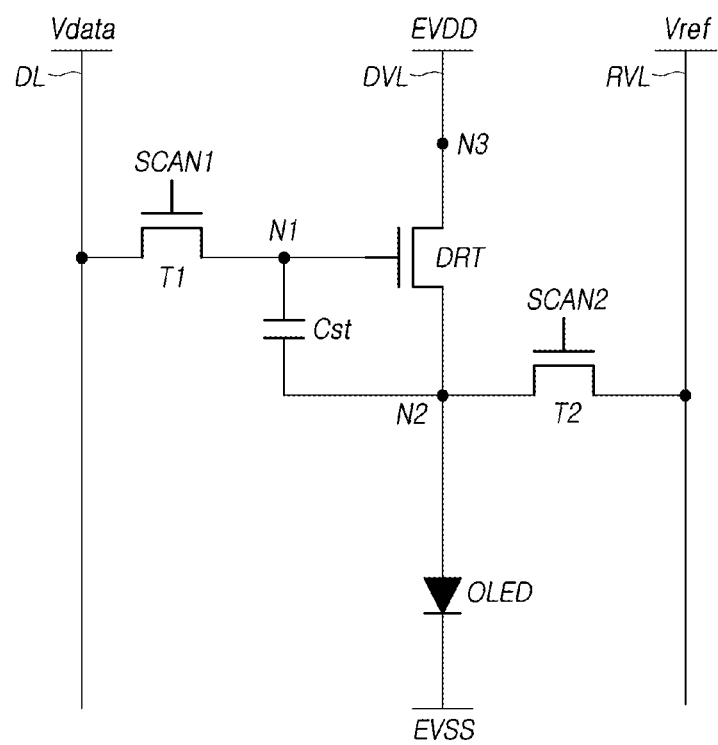
FIG. 4 is a view illustrating an example 3T (Transistor) 1C (Capacitor) structure in which one subpixel SP further includes a second transistor T2 electrically connected between a second node N2 of a driving transistor DRT and a reference voltage line RVL.

FIG. 4 is a view illustrating an example of 3T (Transistor) 1C (Capacitor) structure in which one subpixel SP further includes a second transistor T2 electrically connected between a second node N2 of a driving transistor DRT and a reference voltage line RVL.

Referring to FIG. 4, a second transistor T2 may be electrically connected between a second node N2 of a driving transistor DRT and a reference voltage line RVL and receive a second scan signal SCAN2 through the gate node to be controlled of its On/Off.

The drain node or source node of the second transistor T2 may be electrically connected with the reference voltage line RVL, and the source node or drain node of the second transistor T2 may be electrically connected with the second node N2 of the driving transistor DRT.

The second transistor T2 may be turned on, e.g., in a display driving time period and be turned on in a sensing driving time period for sensing the characteristic values of the driving transistor DRT or the characteristic values of the organic light emitting diode OLED.

In sync with a relevant driving timing (e.g., a display driving timing or an initialization timing in the sensing driving time period), the second transistor T2 may be turned by the second scan signal SCAN2, thereby transferring the reference voltage Vref supplied to the reference voltage line RVL to the second node N2 of the driving transistor DRT.

In sync with a relevant driving timing (e.g., a sampling timing in the sensing driving time period), thereby the second transistor T2 may be turned on by the second scan signal SCAN2, transferring the voltage of the second node N2 of the driving transistor DRT to the reference voltage line RVL.

In other words, the second transistor T2 may control the voltage state of the second node N2 of the driving transistor DRT or transfer the voltage of the second node N2 of the driving transistor DRT to the reference voltage line RVL.

The reference voltage line RVL may be electrically connected with an analog-to-digital converter that senses the voltage of the reference voltage line RVL, converts the voltage into a digital value, and outputs sensing data including the digital value.

The analog-to-digital converter may be included in the source driver integrated circuit (SDIC) that implements the data driver DDR.

The sensing data output from the analog-to-digital converter may be used to sense the characteristic values (e.g., threshold voltage or mobility) of the driving transistor DRT or the characteristic values (e.g., threshold voltage) of the organic light emitting display diode (OLED).

A storage capacitor Cst may be an external capacitor intentionally designed to be outside the driving transistor DRT, but not a parasite capacitor (e.g., Cgs or Cgd) which is an internal capacitor present between the first node N1 and the second node N2 of the driving transistor DRT.

Each of the driving transistor DRT, the first transistor T1, and the second transistor T2 may be a n-type transistor or p-type transistor.

The first scan signal SCAN1 and the second scan signal SCAN2 may be separate gate signals. In this case, the first scan signal SCAN1 and the second scan signal SCAN2, respectively, may be applied to the gate node of the first transistor T1 and the gate node of the second transistor T2 through different gate lines.

In some cases, the first scan signal SCAN1 and the second scan signal SCAN2 may be the same gate signals. In this case, the first scan signal SCAN1 and the second scan signal SCAN2 may be jointly applied to the gate node of the first transistor T1 and the gate node of the second transistor T2 through the same gate line.

The structure of each subpixel illustrated in FIGS. 3 and 4 is merely an example for description, and may further include one or more transistors or, in some cases, one or more storage capacitors.

The plurality of subpixels may have the same structure, or some of the plurality of subpixels may have a different structure.

Figure 5:
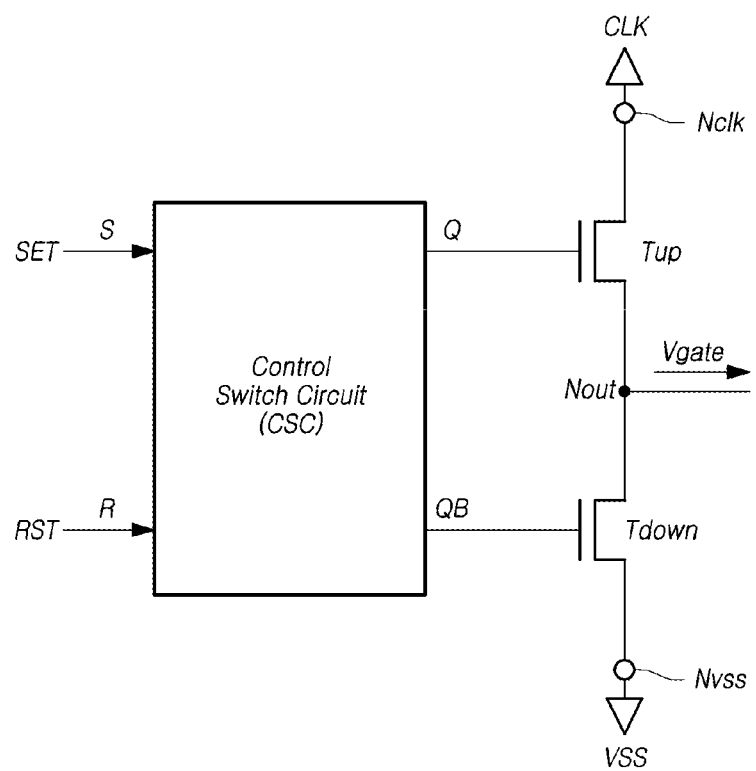
FIG. 5 is a view schematically illustrating a gate driving circuit GDC disposed on a panel PNL according to embodiments of the disclosure.

FIG. 5 is a view schematically illustrating a gate driving circuit GDC disposed on a panel PNL according to embodiments of the disclosure.

Referring to FIG. 5, each gate driving circuit GDC may include a pull-up transistor Tup, a pull-down transistor Tdown, and a control switch circuit CSC.

The control switch circuit CSC is a circuit that controls the voltage of the Q node corresponding to the gate node of the pull-up transistor Tup and the voltage of the QB node corresponding to the gate node of the pull-down transistor Tdown and may include several switches (e.g., transistors).

The pull-up transistor Tup is a transistor that supplies a gate signal Vgate corresponding to a first level voltage (e.g., the high level voltage VGH) to the gate line GL through the gate signal output node Nout. The pull-down transistor Tdown is a transistor that supplies a gate signal Vgate corresponding to a second level voltage (e.g., the low level voltage VGL) to the gate line GL through the gate signal output node Nout. The pull-up transistor Tup and the pull-down transistor Tdown may be turned on at different timings.

The pull-up transistor Tup is electrically connected between a clock signal application node Nclk to which the clock signal CLK is applied and a gate signal output node Nout electrically connected to the gate line GL and is turned on or off by the voltage of the Q node.

The gate node of the pull-up transistor Tup is electrically connected to the Q node. The drain node or source node of the pull-up transistor Tup is electrically connected to the clock signal application node Nclk. The source node or drain node of the pull-up transistor Tup is electrically connected to the gate signal output node Nout from which the gate signal Vgate is output.

The pull-up transistor Tup may be turned on by the voltage of the Q node and outputs the gate signal Vgate having the high level voltage VGH in the high level period of the clock signal CLK to the gate signal output node Nout.

The gate signal Vgate of the high level voltage VGH output to the gate signal output node Nout is supplied to the corresponding gate line GL.

The pull-down transistor Tdown may be electrically connected between the gate signal output node Nout and the base voltage node Nvss and is turned on or off by the voltage of the QB node.

The gate node of the pull-down transistor Tdown is electrically connected to the QB node. The drain node or source node of the pull-down transistor Tdown is electrically connected to the base voltage node Nvss to receive a base voltage VSS corresponding to a constant voltage. The source node or drain node of the pull-down transistor Tdown is electrically connected to the gate signal output node Nout from which the gate signal Vgate is output.

The pull-down transistor Tdown is turned on by the voltage of the QB node, thereby outputting the gate signal Vgate of the low level voltage VGL to the gate signal output node Nout. Accordingly, the gate signal Vgate of the low level voltage VGL may be supplied to the corresponding gate line GL through the gate signal output node Nout. The gate signal Vgate of the low level voltage VGL may be, e.g., the base voltage VSS.

The control switch circuit CSC may include two or more transistors or and has main nodes, such as a Q node, a QB node, a set node S (also referred to as a start node), and a reset node R. In some cases, the control switch circuit CSC may further include an input node to which various voltages, such as the driving voltage VDD, are input.

In the control switch circuit CSC, the Q node is electrically connected to the gate node of the pull-up transistor Tup and repeats charging and discharging.

In the control switch circuit CSC, the QB node is electrically connected to the gate node of the pull-down transistor Tdown and repeats charging and discharging.

In the control switch circuit CSC, the set node S receives the set signal SET for indicating the start of gate driving of the corresponding gate driving circuit GDC.

The set signal SET applied to the set node S may be a start signal VST input from the outside of the gate driver GDR or may be a fed-back signal (carry signal) of the gate signal Vgate output from the gate driving circuit GDC of the previous stage before the current gate driving circuit GDC.

The reset signal RST applied to the reset node R in the control switch circuit CSC may be a reset signal for simultaneously initializing the gate driving circuits GDC of all the stages or may be a carry signal input from another stage (previous or subsequent stage).

The control switch circuit CSC charges the Q node in response to the set signal SET and discharges the Q node in response to the reset signal RST. The control switch circuit CSC may include an inverter circuit to charge or discharge each of the Q node and the QB node at a different timing.

As illustrated in FIG. 3, the driving transistor DRT and the first transistor T1 may be disposed in each of the plurality of subpixels SP in the active area A/A of the panel PNL corresponding to the OLED panel. However, the present embodiments are not limited thereto, and as illustrated in FIG. 4, three or more transistors may be disposed in the active area A/A of the panel PNL corresponding to the OLED panel.

Further, as shown in FIG. 2A, when the gate driving circuit GDC is implemented in a GIP type, that is, when the gate driving circuit GDC is embedded in the panel PNL, various transistors (Tup, Tdown, and transistors in the CSC) constituting the gate driving circuit GDC as shown in FIG. 5 may be disposed in the non-active area N/A which is the outer area of the active area A/A of the panel PNL.

The transistors disposed in the active area A/A and/or the non-active area N/A of the panel PNL have device performance (e.g., mobility or on-off performance) varying depending on the channel length of the active layer. Accordingly, a structure of a dual-type parallel transistor capable of enhancing device performance is described below.

Also described is a structure of a transistor that has a short channel and is freed from degradation of current characteristics with a reduction in the area occupied by the transistor.

For example, the following description focuses primarily on a driving transistor of the electronic device, but transistors according to embodiments of the disclosure are not limited thereto. For example, the description may also be applied to T1 of FIGS. 3, T1 and T2 of FIG. 4, and Tup and Tdown of FIG. 5.

Figure 6:
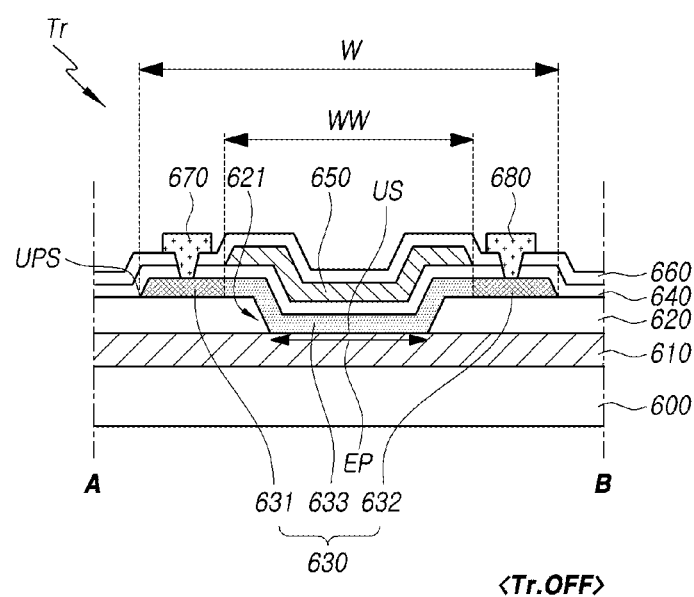
FIG. 6 is a view illustrating a turn off (OFF) state of a transistor disposed in an electronic device according to embodiments of the disclosure.
Figure 7:
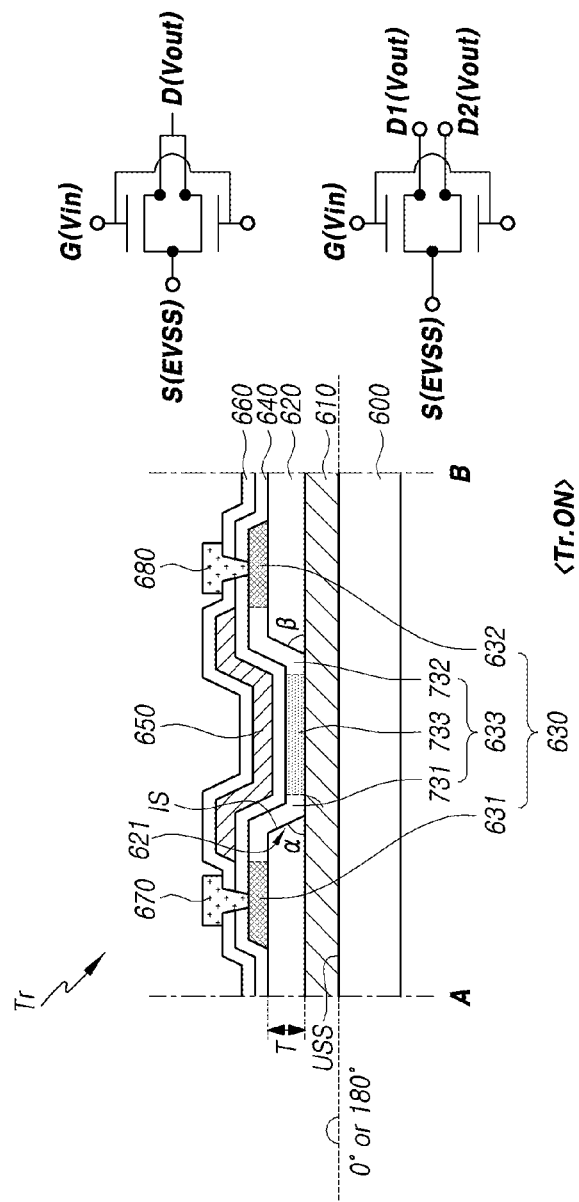
FIG. 7 is a view illustrating a turn on (ON) state of a transistor disposed in an electronic device according to embodiments of the disclosure.

FIG. 6 is a view illustrating a turn off (OFF) state of a transistor disposed in an electronic device according to embodiments of the disclosure. FIG. 7 is a view illustrating a turn on (ON) state of a transistor disposed in an electronic device according to embodiments of the disclosure.

FIGS. 6 and 7 are cross-sectional views taken along line A-B of FIG. 2B.

At least one of transistors disposed in the electronic device according to embodiments of the disclosure may include a vertical-structure transistor Tr in which a channel area 731, 732 is formed in a direction transverse to a direction of a surface of the substrate (e.g., an upper surface USS of the substrate 600) when driven.

For example, this means that the channel areas 731 and 732 of the active layer 630 included in the vertical-structure transistor Tr include an area that is not parallel to the upper surface USS of the substrate 600. Comprehensively, the vertical-structure transistor Tr may include all structures that include an area in which the angle between the channel areas 731 and 732 of the active layer 630 and the substrate 600 is more than 0° and less than 180°.

Referring to FIG. 7, a channel area 731 (or a first channel area 731) forms an angle α with respect to the upper surface USS of the substrate 600. More specifically, in embodiments where a first electrode 610 is present, the first channel area 731 forms an angle α with respect to an upper surface of the first electrode 610. Similarly, a channel area 732 (or a second channel area 732) forms an angle β with respect to the upper surface USS of the substrate 600. More specifically, in embodiments where a first electrode 610 is present, the second channel area 732 forms an angle β with respect to an upper surface of the first electrode 610. As described above, angles α and β are more than 0° and less than 180°. In some embodiments, angle α of the first channel area 731 is identical to angle β of the second channel area 732. In other embodiments, angle α of the first channel area 731 may be different from angle β of the second channel area 732.

As shown in FIG. 7, the first channel area 731 extends from a connection portion 733 that is disposed between the first channel area 731 and the second channel area 732 to a first area 631. The first channel area 731 is disposed along an inclined surface IS of the first insulation film 620 having an inclination angle (e.g., angle α). Similarly, the second channel area 732 extends from the connection portion 733 to a second area 632. The second channel area 732 is disposed along an inclined surface of the second insulation film 620 having an inclination angle (e.g., angle (3).

Referring to FIGS. 6 and 7, the transistor Tr according to embodiments of the disclosure may include a first electrode 610, an active layer 630, a gate electrode 650, a second electrode 670, and a third electrode 680.

For example, the first electrode 610 may be disposed on the substrate 600.

Although FIGS. 6 and 7 illustrate a structure in which the first electrode 610 has a single layer, embodiments of the disclosure are not limited thereto, and the first electrode 610 may have a multilayer structure of two or more layers.

The first electrode 610 may include any one of metals, such as aluminum (Al), gold (Au), silver (Ag), copper (Cu), tungsten (W), molybdenum (Mo), chromium (Cr), tantalum (Ta), and titanium (Ti), or alloys thereof, but embodiments of the disclosure are not limited thereto.

The first electrode 610 may be the source electrode of the transistor Tr.

A first insulation film 620 having at least one hole 621 exposing a portion (e.g., exposed portion EP) of an upper surface US of the first electrode 610 may be disposed on the substrate 600 and the first electrode 610.

The first insulation film 620 may include an inorganic insulating material, such as silicon oxide (SiOx), silicon nitride (SiNx), or silicon oxynitride (SiON).

An active layer 630 may be disposed on the first insulation film 620 and the first electrode 610.

The active layer 630 may be disposed on the side surface (e.g., inclined surface IS) of the first insulation film 620 in the hole 621 of the first insulation film 620 and be disposed on the upper surface US of the first electrode 610. The active layer 630 may be disposed to extend to the periphery of the hole 621 of the first insulation film 620.

Specifically, the active layer 630 may be disposed on a portion of the upper surface UPS of the first insulation film 620 and be disposed on the side surface (e.g., inclined surface IS) of the first insulation film 620 in the hole 621 in which the first insulation film 620 exposes the upper surface US of the first electrode 610. The active layer 630 may contact the upper surface US of the first electrode 610 in the hole 621 of the first insulation film 620.

Accordingly, the active layer 630 may have a structure having at least one step. Although the example figures show one step including an inclined surface IS, other embodiments may include multiple steps including more than one.

The active layer 630 may be formed of, e.g., an oxide semiconductor. When the active layer 630 is an oxide semiconductor, the active layer 630 may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO), but the active layer 630 according to embodiments of the disclosure is not limited thereto.

For example, the active layer 630 may include an IGZO (InGaZnO)-based oxide semiconductor material (where, the concentration of In may be higher than that of Ga), an IZO (InZnO)-based oxide semiconductor material, an IGZTO (InGaZnSnO)-based oxide semiconductor material, an ITZO (InSnZnO)-based oxide semiconductor material, a FIZO (FeInZnO)-based oxide semiconductor material, a ZnO-based oxide semiconductor material, an SIZO (SiInZnO)-based oxide semiconductor material, or a ZnON (ZnOxynitride)-based oxide semiconductor material.

Although FIGS. 6 and 7 illustrate a structure in which the active layer 630 is a single layer, embodiments of the disclosure are not limited thereto, and the active layer 630 may have a multilayer structure of two or more layers.

A second insulation film 640 may be disposed on the active layer 630.

The second insulation film 640 may include an inorganic insulating material, such as silicon oxide (SiOx), silicon nitride (SiNx), or silicon oxynitride (SiON).

The gate electrode 650 of the transistor Tr may be disposed on the second insulation film 640.

Although FIGS. 6 and 7 illustrate a structure in which the gate electrode 650 has a single layer, embodiments of the disclosure are not limited thereto, and the gate electrode 650 may have a multilayer structure of two or more layers.

The gate electrode 650 may include any one of metals, such as aluminum (Al), gold (Au), silver (Ag), copper (Cu), tungsten (W), molybdenum (Mo), chromium (Cr), tantalum (Ta), and titanium (Ti), or alloys thereof, but embodiments of the disclosure are not limited thereto.

The gate electrode 650 may overlap a portion of each of the first electrode 610 and the active layer 630.

The gate electrode 650 may overlap the hole 621 of the first insulation film 620.

A third insulation film 660 may be disposed on the gate electrode 650.

The third insulation film 660 may include an inorganic insulating material, such as silicon oxide (SiOx), silicon nitride (SiNx), or silicon oxynitride (SiON).

On the third insulation film 660, the second electrode 670 and the third electrode 680 of the transistor Tr may be spaced apart and disposed.

The second electrode 670 may contact the first area 631 of the active layer 630 through a contact hole provided in the second insulation film 640 and the third insulation film 660.

The third electrode 680 may contact the second area 632 of the active layer 630 through another contact hole provided in the second insulation film 640 and the third insulation film 660.

The second electrode 670 and the third electrode 680 may be the drain electrode of the transistor Tr.

The active layer 630 electrically connected to the second electrode 670 and the third electrode 680 may include a first area 631, a second area 632, and a third area 633.

As illustrated in FIGS. 6 and 7, the first area 631 and the second area 632 of the active layer 630 are areas disposed on the first insulation film 620 and may be doped areas (or conductive areas).

The third area 633 of the active layer 630 may be disposed between the first area 631 and the second area 632.

The third area 633 of the active layer 630 may be disposed on the side surface of the hole 621 of the first insulation film 620 from a portion of the upper surface of the first insulation film 620 and be disposed on the upper surface of the first electrode 610 overlapping the hole 621 of the first insulation film 620.

Referring to FIG. 6, when the transistor Tr is in an OFF state (e.g., when no gate bias is applied), the resistances of the first area 631 and the second area 632 of the active layer 630 may be lower than the resistance of the third area 633 of the active layer 630.

In other words, the first and second areas 631 and 632 of the active layer 630 are doped areas (or conductive areas) and may thus be higher in the concentration of carriers (e.g., electrons) than the third area 633.

The first to third areas 631, 632, and 633 of the active layer 630 may be integrally formed. For example, the first to third areas 631, 632, and 633 of the active layer 630 may be formed continuous and contiguous to each other. A width W defined by each opposite end of the active layer 630 may be greater than a width WW defined by each opposite end of the gate electrode 650. The width W of the active layer 630 may be smaller than that of the first electrode 610. As shown in the FIG. 6 through the dotted lines, two opposite ends of the third area 633 of the active layer 630 may correspond to two opposite ends of the gate electrode 650.

The width of the first electrode 610 may be larger than the width W of the active layer 630. Accordingly, it is possible to prevent light incident from under the substrate 600 from reaching the active layer 630. The width W of the active layer 630 and the width of the first electrode 610 are lengths along a direction perpendicular to the direction in which the first electrode 610 is stacked on the substrate 600, and the width W of the active layer 630 may mean the shortest distance between the two opposite ends of the active layer 630.

In other words, as the first electrode 610 serves as both a light blocking layer (or a light shielding layer) and the source electrode of the transistor Tr, it is possible to simplify the structure of the transistor Tr and manufacturing method while saving manufacturing costs (for example, saving the extra manufacturing step of forming a light shielding layer underneath the transistor). That is, the novel vertical-structure transistor according to one or more embodiments, not only provides an improved channel design, it also utilizes less components which also leads to less manufacturing steps and reduced costs.

The entire third area 633 of the active layer 630 may overlap the gate electrode 650 along the direction in which the first electrode 610 is stacked on the substrate 600.

Referring to FIG. 7, when the transistor Tr is in an ON state (e.g., when a gate bias is applied), channel areas 731 and 732 having a lower carrier concentration than other areas may be provided in the active layer 630.

The channel areas 731 and 732 may be included in the third area 633 of the active layer 630.

When no gate bias is applied to the transistor Tr, the resistance of the third area 633 is larger than the resistances of the first and second areas 631 and 632 of the active layer 630, so that carriers present in the first and second areas 631 and 632 may have difficulty in moving to the third area 633.

In contrast, when a gate bias is applied to the transistor Tr, the carrier concentration may be increased in a partial area of the third area 633 of the active layer 630 overlapping the gate electrode 650 due to the gate field.

Accordingly, carriers present in the first and second areas 631 and 632 of the active layer 630 may move to the first electrode 610 through the third area 633.

In this case, a portion of the third area 633 may be a path through which the carriers move, but the other portion of the third area 633 may not allow carriers to move therethrough.

The third area 633 of the active layer 630 where carriers are moved as a gate bias is applied to the transistor Tr may be defined as a first channel area 731 and a second channel area 732.

In other words, when the transistor Tr is in an ON state, the third area 633 of the active layer 630 may include the first channel area 731, the second channel area 732, and a connecting portion 733.

Referring to FIG. 7, the first channel area 731 may extend from the first area 631 of the active layer 630 and be disposed on a portion of the upper surface of the first insulation film 620 and be disposed on the side surface of the hole 621 of the first insulation film 620, and be disposed up to a portion of the upper surface of the first electrode 610 overlapping the hole 621.

The second channel area 732 may extend from the second area 632 of the active layer 630 and be disposed on a portion of the upper surface of the first insulation film 620 and be disposed on the side surface of the hole 621 of the first insulation film 620, and be disposed up to a portion of the upper surface of the first electrode 610 overlapping the hole 621.

The connecting portion 733 of the third area 633 may contact the upper surface of the first electrode 610 overlapping the hole 621 of the first insulation film 620 and be disposed between the first channel area 731 and the second channel areas 732.

The first channel area 731 and the second channel area 732 may be symmetrically disposed with respect to the connecting portion 733 of the third area 633.

The length of each of the first channel area 731 and the second channel area 732 may be the sum of a first length of the area disposed on the first insulation film 620, a second length of the area disposed on the side surface (the side surface in the hole) of the first insulation film 620, and a third length of the area in contact with the upper surface of the first electrode 610.

The first and third lengths of each of the first and second channel areas 731 and 732 may be lengths in a direction parallel to the surface of the substrate 600.

The second length of each of the first and second channel areas 731 and 732 may correspond to the length of the side surface of the first insulation film 620 where the active layer 630 is disposed.

The length of each of the first and second channel areas 731 and 732 of the active layer 630 includes the second length and may thus be adjusted by the length of the side surface of the first insulation film 620.

If the height T (the length in the direction in which the first electrode 610 is stacked on the substrate 600) of the first insulation film 620 is reduced, the length of the side surface of the first insulation film 620 is also decreased, and the lengths of the first and second channel areas 731 and 732 of the active layer 630 may also be decreased. In other words, the lengths of the first and second channel areas 731 and 732 of the active layer 630 may be directly proportional to the length of the side surface of the first insulation film 620.

In other words, in the vertical-structure transistor Tr according to embodiments of the disclosure, rather than determining the lengths of the first and second channel areas 731 and 732 of the active layer 630 through a separate process (e.g., photolithography), it is possible to adjust the lengths of the first and second channel areas 731 and 732 of the active layer 630 only by adjusting the length (or height T of the first insulation film 620) of the side surface of the first insulation film 620.

When the transistor Tr according to embodiments of the disclosure is in an ON state, carriers moving from the first and second areas 631 and 632 of the active layer 630 may move to the first electrode 610 through the first and second channel areas 731 and 732.

In this case, since the carriers move along the shortest path, the carriers do not move to the third area 633 positioned far from the first area 631 and the second area 632.

Accordingly, the connecting portion 733 of the active layer 630 may exist between the first channel area 731 and the second channel area 732. The connecting portion 733 may be positioned between the first channel area 731 and the second channel area 732, and the first and second channel areas 731 and 732 may be integrally formed with the connecting portion 733.

Since carriers do not move to the connecting portion 733 of the active layer 630, when the transistor Tr is in an ON state, the resistance of the connecting portion 733 of the active layer 630 may be higher than the resistance of the first and second channel areas 731 and 732.

The transistor Tr according to embodiments of the disclosure may include two drain electrodes (e.g., the second electrode 670 and the third electrode 680) as shown in FIG. 7. The same signal may be applied to each drain electrode.

The structure of the vertical-structure transistor Tr according to embodiments of the disclosure is not limited thereto, and different signals may be applied to the second electrode 670 and the third electrode 680.

In other words, the gate electrode 650 (G) of the transistor Tr may be connected to an input line Vin connected to an external input terminal, the first electrode 610, which is the source electrode (S) of the vertical-structure transistor Tr, may be connected to the ground EVSS, and the same output line Vout or different output lines Vout may be connected to the second electrode 670 and third electrode 680, which are the drain electrodes (D, D1, and D2).

As such, although the transistor Tr includes one source electrode, one active layer 630, and one gate electrode 650, the transistor Tr may have two channel areas 731 and 732 since it has two drain electrodes.

Meanwhile, horizontal-structure transistors require photolithography for fine sizes to reduce the length of the channel area of the active layer. However, due to limits to photolithography systems, reducing the length of the channel area is limited.

Further, although an active layer with a short channel is formed by the photolithography system, the transistors Tr formed in the electronic device (e.g., the panel PNL) may have inconstant, uneven channel area lengths.

In contrast, in the vertical-structure transistor Tr according to an embodiment, a portion of the active layer 630 and a portion of the source electrode (e.g., the first electrode 610) contact each other under the active layer 630 having a step, and the drain electrodes (e.g., the second electrode 670 and the third electrode 680) to which the same signal or different signals is applied are included. Thus, since the vertical-structure transistor Tr may include two channel areas 731 and 732 having short lengths, photolithography for forming an active layer with a short channel area need not be applied.

It is possible to have such an effect as if two transistors having a short channel area are placed, without increasing the number of transistors Tr according to embodiments of the disclosure.

Accordingly, it is possible to enhance current characteristics while reducing the area occupied by the transistor Tr.

Referring to FIGS. 6 and 7, such a structure in which the channel areas 731 and 732 have a direction crossing the surface of the substrate 600 by allowing the active layer 630 to have at least one step using the hole 621 of the first insulation film 620 is provided. However, the structure according to the disclosure is not limited thereto.

Figure 8:
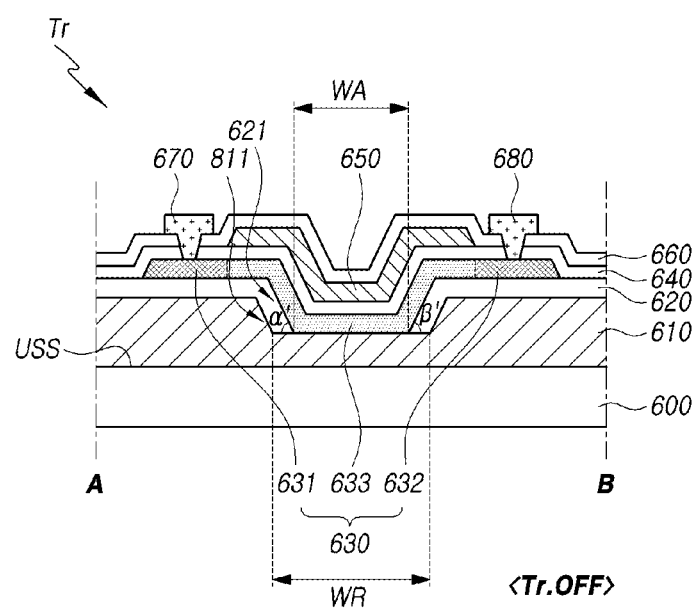
FIGS. 8 and 9 are views illustrating a cross-sectional structure of a transistor according to embodiments of the disclosure.
Figure 9:
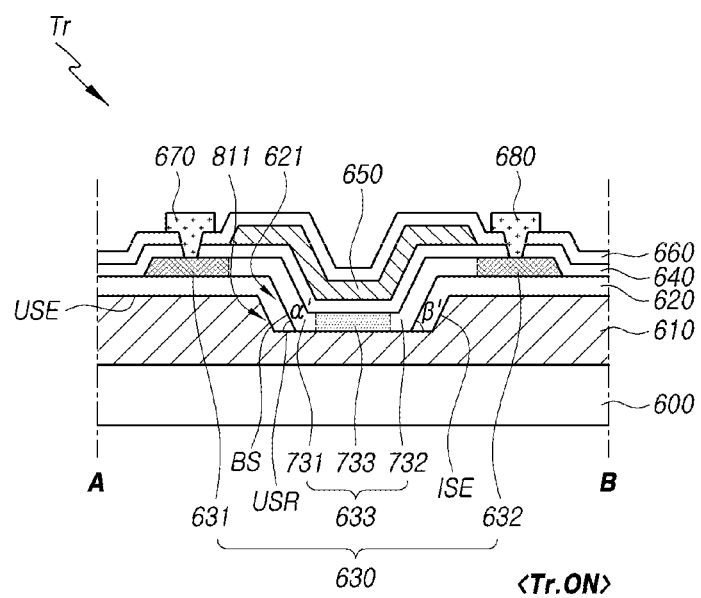

FIGS. 8 and 9 are views illustrating a cross-sectional structure of a transistor according to embodiments of the disclosure.

FIGS. 8 and 9 are cross-sectional views taken along line A-B of FIG. 2B.

Substantially the same configurations and effects as those described above are not repeatedly described below.

Referring to FIGS. 8 and 9, the transistor Tr according to embodiments of the disclosure may include a first electrode 610, an active layer 630, a gate electrode 650, a second electrode 670, and a third electrode 680.

The first electrode 610 may include at least one recess 811.

The first insulation film 620 may be disposed on the substrate 600 where the first electrode 610 is disposed.

The first insulation film 620 may be disposed on a portion of the upper surface of the first electrode 610. For example, as illustrated in FIGS. 8 and 9, the first insulation film 620 may be disposed to expose a portion of the upper surface of the first electrode 610 in an area overlapping the recess 811 of the first electrode 610.

In other words, a portion of the recess 811 of the first electrode 610 may overlap the entire hole 621 of the first insulation film 620.

FIGS. 8 and 9 illustrate the structure in which the first insulation film 620 is partially disposed in the recess 811 of the first electrode 610. However, the structure of the transistor Tr according to embodiments of the disclosure is not limited thereto.

For example, the first insulation film 620 may not overlap a portion of the recess 811 of the first electrode 610.

In other words, the first insulation film 620 may be disposed to expose a portion of the upper surface of the first electrode 610 in an area overlapping the recess 811 of the first electrode 610.

An active layer 630 may be disposed on the first insulation film 620 and the first electrode 610.

The active layer 630 may include a first area 631, a second area 632, and a third area 633.

The active layer 630 may have a structure covering the recess 811 of the first electrode 610. In other words, the active layer 630 may overlap the entire recess 811 of the first electrode 610 and may also be disposed in a surrounding area of the recess 811 of the first electrode 610.

Accordingly, the active layer 630 may be formed to have at least one step due to the recess 811 of the first electrode 610.

The first area 631 and the second area 632 of the active layer 630 may contact the first insulation film 620.

A portion of the third area 633 of the active layer 630 may contact the upper surface of the first electrode 610 in the recess 811 of the first electrode 610. The remaining portion of the third area 633 may contact a portion of the upper surface of the first insulation film 620. For example, the remaining portion of the third area 633 may contact the surface of the first insulation film 620 disposed in an area that does not overlap the recess 811 of the first electrode 610 and may also contact the surface of the first insulation film 620 disposed in the area corresponding to the recess 811 of the first electrode 610.

A second insulation film 640 may be disposed on the active layer 630.

A gate electrode 650 may be disposed on the second insulation film 640.

The gate electrode 650 may overlap a portion of each of the first electrode 610 and the active layer 630.

A portion of the gate electrode 650 may overlap the entire recess 811 of the first electrode 610.

The gate electrode 650 may not overlap a portion of the active layer 630 in an area that does not overlap the recess 811 of the first electrode 610. For example, the gate electrode 650 may not overlap each of the first area 631 and the second area 632 of the active layer 630.

A third insulation film 660 may be disposed on the gate electrode 650.

On the third insulation film 660, the second electrode 670 and the third electrode 680 of the transistor Tr may be spaced apart and disposed.

As shown in FIG. 8, when the transistor Tr is in an OFF state (when no gate bias is applied), the resistances of the first area 631 and the second area 632 of the active layer 630 may be lower than the resistance of the third area 633 of the active layer 630.

As shown in FIG. 9, when the transistor Tr is in an ON state (when a gate bias is applied), channel areas 731 and 732 having a lower carrier concentration than other areas may be provided in the active layer 630.

When the transistor Tr is in an ON state, the third area 633 of the active layer 630 may include the first channel area 731, the second channel area 732, and a connecting portion 733.

Referring to FIG. 9, the first channel area 731 may extend from the first area 631 of the active layer 630 and be disposed on a portion of the upper surface of the first insulation film 620 and be disposed in an area corresponding to a portion of the side surface of the recess 811 of the first electrode 610, and be disposed up to a portion of the upper surface of the first electrode 610 overlapping the recess 811.

The second channel area 732 may extend from the second area 632 of the active layer 630 and be disposed on a portion of the upper surface of the first insulation film 620 and be disposed in an area corresponding to a portion of the side surface of the recess 811 of the first electrode 610, and be disposed up to a portion of the upper surface of the first electrode 610 overlapping the recess 811.

The connecting portion 733 of the third area 633 may contact the upper surface of the first electrode 610 in the recess 811 of the first electrode 610 and be disposed between the first channel area 731 and the second channel areas 732.

The first channel area 731 and the second channel area 732 may be symmetrically disposed with respect to the connecting portion 733 of the third area 633.

Referring to FIGS. 8 and 9, the first channel area 731 forms an angle α' with respect to the upper surface USS of the substrate 600. More specifically, in this embodiment where a first electrode 610 with a recess 811 is present, a bottom surface BS of the first channel area 731 forms an angle α' with respect to an upper surface USR of the first electrode 610 in the recess 811. Similarly, the second channel area 732 forms an angle β' with respect to the upper surface USS of the substrate 600. More specifically, in this embodiment, a bottom surface of the second channel area 732 forms an angle β' with respect to the upper surface USR of the first electrode 610 in the recess 811. As described above, angles α' and β' are more than 0° and less than 180°. In some embodiments, angle α' of the first channel area 731 is identical to angle β' of the second channel area 732. In other embodiments, angle α' of the first channel area 731 may be different from angle β' of the second channel area 732. In some embodiments where a recess is present in the first electrode 610, the angle α' may be greater than angle α (see FIGS. 6 and 7). Similarly, the angle β' may be greater than angle β (see FIGS. 6 and 7).

In one embodiment, as shown in FIG. 8, a width WR of the recess portion 811 is greater than a width WA of the hole 621 (e.g., area where the hole 621 exposes the surfaces of the first electrode 610).

In one embodiment, due to the recess portion 811 of the first electrode 610, the subsequent layers deposited on top of the recess portion 811 also includes a recessed portion in corresponding locations of the respective layers (e.g., 640, 650, 660).

In FIG. 9, the length of each of the first and second channel areas 731 and 732 may be proportional to the height of the recess 811 of the first electrode 610 where the active layer 630 is disposed.

In other words, it is possible to adjust the length of each of the first and second channel areas 731 and 732 by adjusting the height of the recess 811 of the first electrode 610.

As shown in both FIGS. 8 and 9, the first electrode 610 includes a top or upper surface that contacts and faces the first insulation film 620. Unlike the embodiments shown in FIGS. 6 and 7, the first electrode 610 includes the recess portion 811. Accordingly, the top surface of the first electrode 610 has at least three parts or portions. The first electrode 610 includes a top surface USE that is above a top surface USR in the recess portion 811. The first electrode 610 also includes an inclination surface ISE between the top surface USE of the first electrode 610 and the top surface USR of the first electrode 610 in the recess portion 811.

Although a configuration in which the active layer 630 is an oxide semiconductor has been described in connection with FIGS. 6 to 9, embodiments of the disclosure are not limited thereto.

For example, the transistor Tr may be a CMOS transistor. This is described below with reference to FIGS. 10 and 11.

Figure 10:
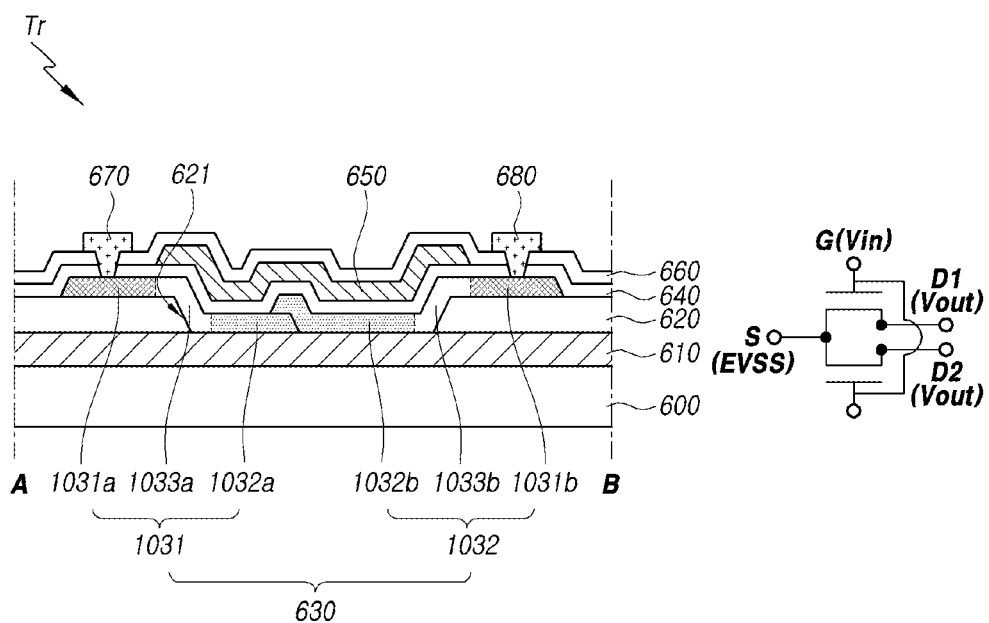
FIGS. 10 and 11 are views illustrating a structure of a transistor which is a polycrystalline silicon transistor.
Figure 11:
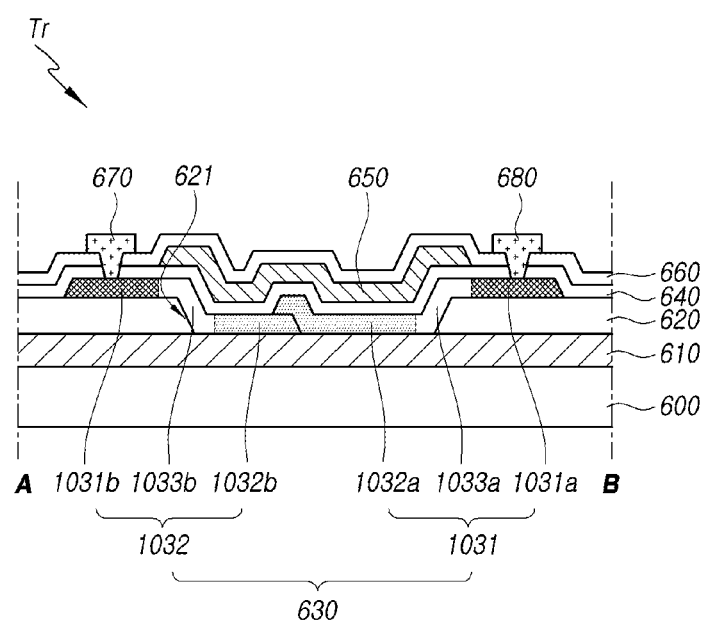

FIGS. 10 and 11 are views illustrating a structure of a transistor which is a polycrystalline silicon transistor.

FIGS. 10 and 11 are cross-sectional views taken along line A-B of FIG. 2B.

Substantially the same configurations and effects as those described above are not repeatedly described below.

Referring to FIGS. 10 and 11, a first electrode 610 may be disposed on the substrate 600. A first insulation film 620 having at least one hole 621 exposing a portion of an upper surface of the first electrode 610 may be disposed on the substrate 600 and the first electrode 610.

An active layer 630 may be disposed on the first insulation film 620 and the first electrode 610.

The active layer 630 may include a first active layer 1031 and a second active layer 1032.

The first and second active layers 1031 and 1032 may be formed of poly silicon, but embodiments of the disclosure are not limited thereto.

Referring to FIG. 10, the first active layer 1031 may include a first portion 1031a and a second portion 1032a spaced apart from each other and may include a third portion 1033a positioned between the first portion 1031a and the second portion 1032a.

Referring to FIG. 10, the first portion 1031a of the first active layer 1031 may be an area where $N^+$ impurity ions are implanted. The second portion 1032a and the third portion 1033a of the first active layer 1031 may be areas where ions are not implanted.

The structure of the first active layer 1031 according to embodiments of the disclosure is not limited thereto, and ions may also be implanted into the second portion 1032a.

The third portion 1033a of the first active layer 1031 may be a channel area through which carriers move when the transistor Tr is in an ON state. The third portion 1033a may include a portion disposed on an area not overlapping the hole 621 of the first insulation film 620, a portion disposed on an area overlapping the side surface of the hole 621 of the first insulation film 620, and a portion disposed on the upper surface of the first electrode 610 in the hole 621 of the first insulation film 620.

When the transistor Tr is in an ON state, carriers of the first portion 1031a may move from the third portion 1033a to the first electrode 610 through the contact area between the third portion 1033a and the first electrode 610.

Referring to FIG. 10, the second active layer 1032 may include a fourth portion 1031b and a fifth portion 1032b spaced apart from each other and a sixth portion 1033b positioned between the fourth portion 1031b and the fifth portion 1032b.

Referring to FIG. 10, the fourth portion 1031b of the second active layer 1032 may be an area where $P^+$ impurity ions are implanted. The fifth portion 1032b and the sixth portion 1033b of the second active layer 1032 may be areas where ions are not implanted.

The structure of the second active layer 1032 according to embodiments of the disclosure is not limited thereto, and ions may also be implanted into the fifth portion 1032b.

The sixth portion 1033b of the second active layer 1032 may be a channel area through which carriers move when the transistor Tr is in an ON state. The sixth portion 1033b may include a portion disposed on an area not overlapping the hole 621 of the first insulation film 620, a portion disposed on an area overlapping the side surface of the hole 621 of the first insulation film 620, and a portion disposed on the upper surface of the first electrode 610 in the hole 621 of the first insulation film 620.

The channel area of each of the first active layer 1031 and of the second active layer 1032 may have a length that is the sum of the length of the portion disposed on the area not overlapping the hole 621 of the first insulation film 620, the length of the portion disposed on the area overlapping the side surface of the hole 621 of the first insulation film 620, and the length of the portion disposed on the first electrode 610 in the hole 621 of the first insulation film 620.

When the transistor Tr is in an ON state, carriers of the fourth portion 1031b may move from the sixth portion 1033b to the first electrode 610 through the contact area between the sixth portion 1033b and the first electrode 610.

In other words, the channel area of each of the first and second active layers 1031 and 1032 may be adjusted through the height of the first insulation film 620.

Referring to FIG. 10, a portion of the first active layer 1031 and a portion of the second active layer 1032 may overlap each other in the hole 621 of the first insulation film 620.

For example, a portion of the second portion 1032a of the first active layer 1031 and a portion of the fifth portion 1032b of the second active layer 1032 may overlap each other.

As described above, since a portion of the first active layers 1031 and a portion of the second active layer 1032 are disposed to overlap each other, the area occupied by the transistor Tr may be reduced, thereby increasing the degree of device integration.

The second insulation film 640 may be disposed on the first and second active layers 1031 and 1032.

A gate electrode 650 may be disposed on the second insulation film 640.

In the gate electrode 650, the first portion 1031a of the first active layer 1031 and the fourth portion 1031b of the second active layer 1032 may not overlap the gate electrode 650.

A third insulation film 660 may be disposed on the gate electrode 650.

On the third insulation film 770, a second electrode 670 and a third electrode 680 of the transistor Tr may be spaced apart and disposed.

The second electrode 670 may be electrically connected to any one of the first portion 1031a of the first active layer 1031 and the fourth portion 1031b of the second active layer 1032, and the third electrode 680 may be electrically connected to the other.

Referring to FIG. 10, the gate electrode 650 of the transistor Tr may be connected to an input line Vin connected to an external input terminal, and the second and third electrodes 670 and 680, which are drain electrodes, may be connected to different output lines Vout connected to external output terminals. Further, the first electrode 610, which is the source electrode electrically connected to the first and second active layers 1031 and 1302, may be connected to the ground EVSS.

Although FIG. 10 illustrates a structure in which the second active layer 1032 is disposed on a portion of the first active layer 1031 in the hole 621 of the first insulation film 620, embodiments of the disclosure are not limited thereto.

As illustrated in FIG. 11, the first active layer 1031 may be disposed on a portion of the second active layer 1032.

As such, one transistor Tr may include the first active layer 1031 of NMOS and the second active layer 1032 of PMOS and may include one source electrode, one gate electrode, and two drain electrodes. Accordingly, it is possible to implement a vertical-structure transistor having a complementary metal-oxide semiconductor (CMOS) structure using different types of active layers (e.g., P-type and N-type).

Such a vertical-structure transistor Tr may be applied to the panel PNL, which is an electronic device, and the vertical-structure transistor Tr shown in FIGS. 6 to 11 may be disposed in the subpixel SP of the active area, and may be connected to the pixel electrode.

This is described below with reference to FIG. 12.

Figure 12:
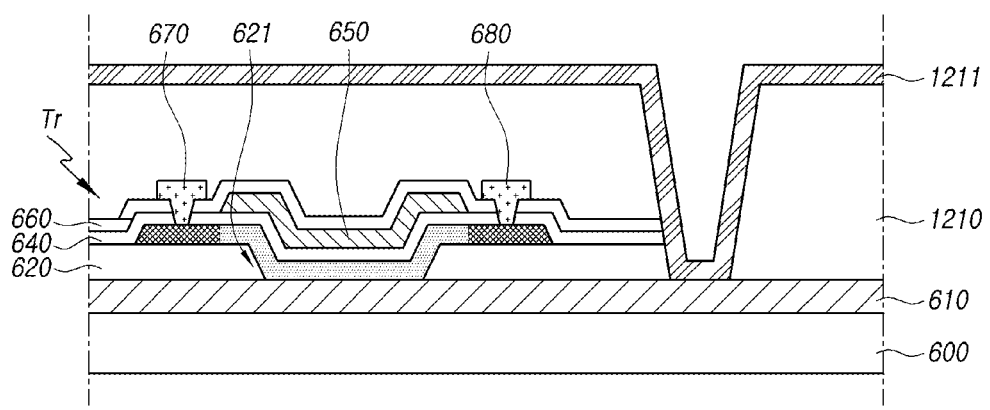
FIG. 12 is a view illustrating a vertical-structure transistor connected with a pixel electrode when the vertical-structure transistor is disposed in a subpixel according to embodiments of the disclosure.

FIG. 12 is a view illustrating a vertical-structure transistor connected with a pixel electrode when the vertical-structure transistor is disposed in a subpixel according to embodiments of the disclosure.

Referring to FIG. 12, among the vertical transistors Tr disposed in the subpixels SP in the active area A/A, there may be a transistor DRT in which the first electrode 610 should be electrically connected with the pixel electrode 1211.

A passivation layer 1210 may be disposed while covering the gate electrode 650 of the transistor Tr. Although FIG. 12 illustrates a configuration in which the passivation layer 1210 is disposed on the gate electrode 650 for convenience of description, embodiments of the disclosure are not limited thereto, and other components, such as another insulation film, may be added between the gate electrode 650 and the passivation layer 1210.

The pixel electrode 1211 may be positioned on the passivation layer 1210. The pixel electrode 1211 may be connected with the first electrode 610 through a hole in the passivation layer 1210. The first electrode 610 may be the source electrode, but embodiments of the disclosure are not limited thereto.

For example, the pixel electrode 1211 may also be connected with the drain electrode.

Although FIG. 12 illustrates a configuration in which the transistor Tr of the disclosure is disposed in the active area A/A, the transistor Tr according to embodiments of the disclosure may be disposed in the non-active area which is the outer area of the panel PNL.

Since the area occupied by the vertical-structure transistor Tr is smaller than the area occupied by the horizontal-structure transistor Tr, when the transistor TR according to embodiments of the disclosure is disposed in the non-active area, the non-active area (also referred to as a bezel area) may be reduced.

Further, since one transistor Tr has two channel areas, the transistor Tr may have high current characteristics although disposed in a small area.

Further, since the active layer 630 has a short channel, the transistor Tr according to embodiments of the disclosure may have on-current characteristics. Further, the S-coefficient may be increased by adjusting the thickness (or height) of the first insulation film 620 overlapping the channel area or the thickness (or height) of the first electrode 610 to be larger only in some portion, rendering it possible to increase the available data voltage range.

In other words, the transistor Tr according to embodiments of the disclosure may have high current characteristics while appropriately increasing the S-coefficient.

Figure 13:
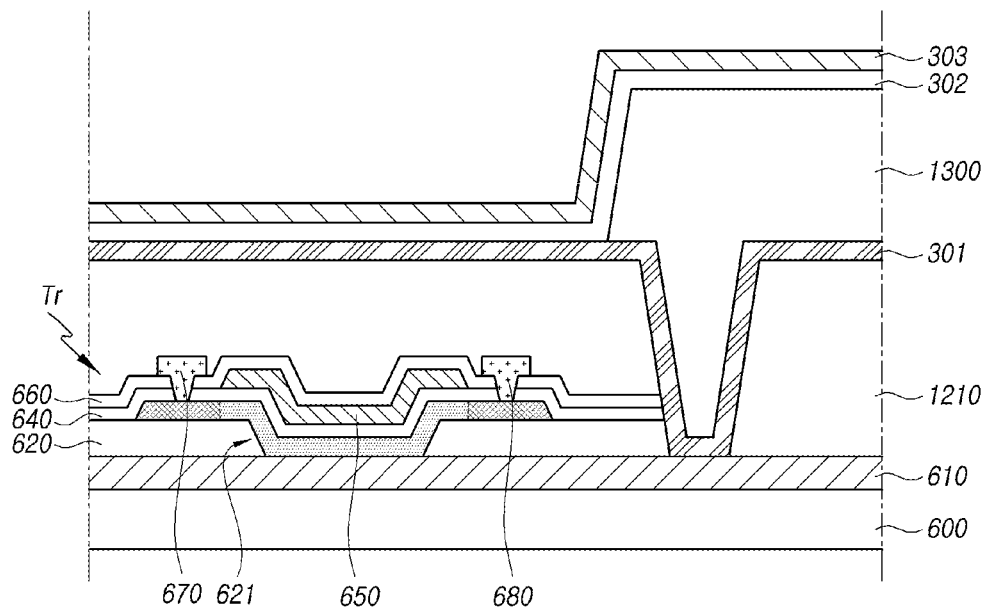
FIG. 13 is a view illustrating a vertical-structure transistor connected with an organic light emitting diode when the vertical-structure transistor is disposed in a subpixel according to embodiments of the disclosure.

As illustrated in FIG. 13, the transistor Tr according to embodiments of the disclosure may be connected to the organic light emitting diode.

FIG. 13 is a view illustrating a vertical-structure transistor connected with an organic light emitting diode when the vertical-structure transistor is disposed in a subpixel according to embodiments of the disclosure.

Referring to FIG. 13, the anode electrode 301 of the organic light emitting diode may be disposed on the passivation layer 1210.

A bank 1300 may be disposed on a portion of the passivation layer 1210 and the anode electrode 301.

The organic layer 302 of the organic light emitting diode may be disposed on the bank 1300 and the anode electrode 301. The cathode electrode 303 may be disposed on the organic layer 302.

The first electrode 610 of the transistor Tr according to embodiments of the disclosure may be electrically connected to the anode electrode 301 of the organic light emitting diode disposed on the passivation layer 1210.

Although FIGS. 12 and 13 illustrate a structure in which the transistor Tr according to embodiments of the disclosure is used in one subpixel, embodiments of the disclosure are not limited thereto.

Figure 14:
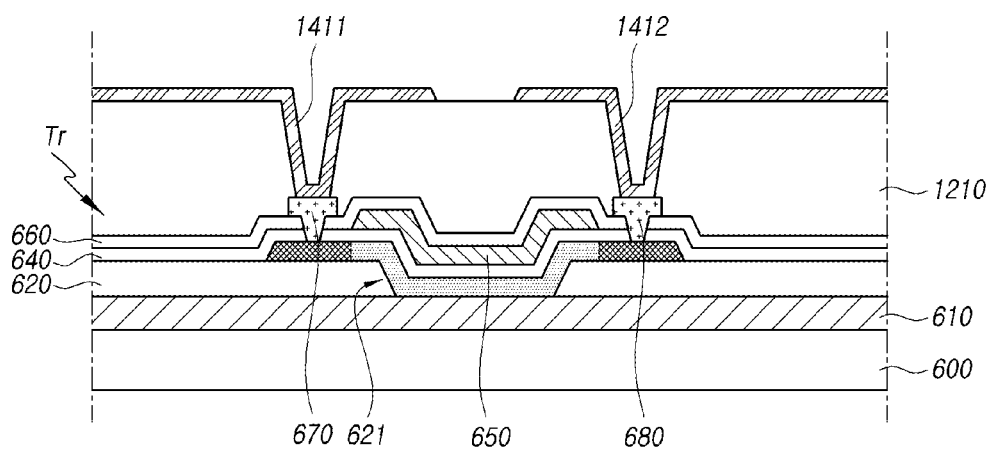
FIG. 14 is a view illustrating a structure in which a transistor according to embodiments of the disclosure is applied to two subpixels.

FIG. 14 is a view illustrating a structure in which a transistor according to embodiments of the disclosure is applied to two subpixels.

Referring to FIG. 14, the first pixel electrode 1411 may be electrically connected to the second electrode 670 of the transistor Tr, and the second pixel electrode 1412 spaced apart from the first pixel electrode 1411 may be electrically connected to the third electrode 680.

In other words, as the pixel electrodes in different subpixels share one transistor (e.g., driving transistor), the structure of the electronic device may be simplified.

Although the foregoing description focuses primarily on a structure in which the transistor according to embodiments of the disclosure is a driving transistor, the transistor according to embodiments of the disclosure may also be used for other transistors included in the electronic device.

When the transistor is used as a transistor other than a driving transistor, different signals may be applied to the second and third electrodes 670 and 680.

Comparison between the S-coefficient (SS) of a transistor Tr and its according increment in current according to embodiments of the disclosure and the S-coefficient (SS) of a transistor Tr and its according increment in current according to a comparative example is described below with reference to FIG. 15.

Figure 15:
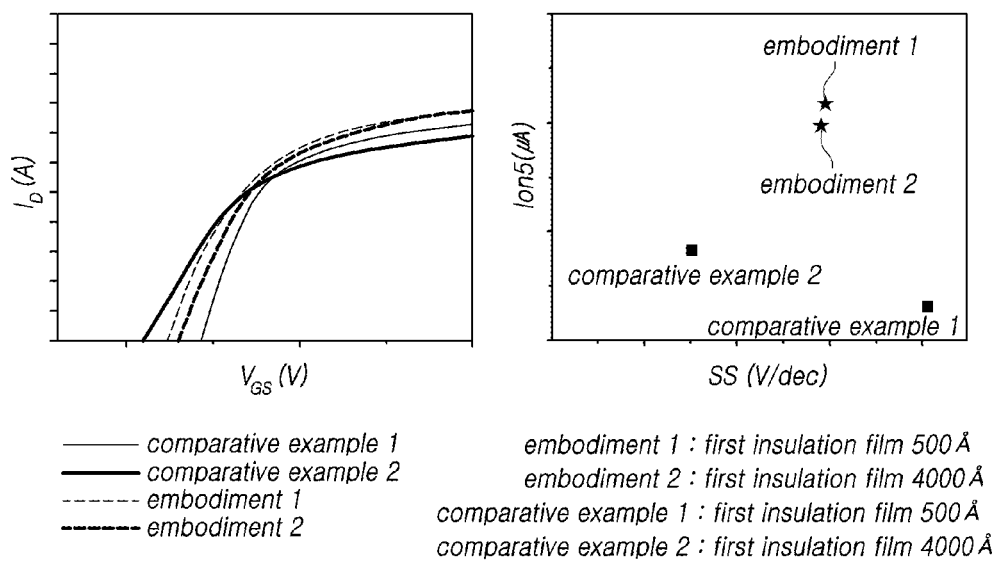
FIG. 15 is a view illustrating comparison between the S-coefficient (SS) of a transistor Tr and its according increment in current according to embodiments of the disclosure and the S-coefficient (SS) of a transistor Tr and its according increment in current according to a comparative example.

FIG. 15 is a view illustrating comparison between the S-coefficient (SS) of a transistor Tr and its according increment in current according to embodiments of the disclosure and the S-coefficient (SS) of a transistor Tr and its according increment in current according to a comparative example.

Referring to FIG. 15, comparative example 1 may have a structure in which the thickness of the insulation film disposed under the active layer of the normal coplanar-structure transistor is 500 Å, and comparative example 2 may have a structure in which the thickness of the insulation film disposed under the active layer of the normal coplanar-structure transistor is 4000 Å.

Embodiment 1 may have a structure in which the thickness of the first insulation film 620 disposed under the active layer 630 of the transistor according to embodiments of the disclosure is 500 Å, and embodiment 2 may have a structure in which the thickness of the first insulation film 620 disposed under the active layer 630 of the transistor according to embodiments of the disclosure is 4000 Å.

The SS value and current increment of FIG. 15 may be derived through current value data according to the gate voltage of each transistor.

Referring to FIG. 15, the SS value of the transistor according to comparative example 1 is high, but the current increment is very low as compared with the transistors according to comparative example 1, embodiment 1, and embodiment 2.

The SS value of the transistor according to comparative example 2 is low as compared with that of comparative example 1, and the current increment may be very low as compared those of the transistors according to embodiment 1 and embodiment 2.

In contrast, the transistors according to embodiment 1 and embodiment 2 may have a higher SS value than that of the transistor according to comparative example 1 and a higher current increment than those of the transistors according to comparative example 1 and comparative example 2.

In other words, the transistors according to embodiments 1 and 2 may have a high SS value and a high current increment.

According to embodiments of the disclosure, there may be provided a thin film transistor array substrate including a vertical-structure transistor capable of implementing a short channel and integration and an electronic device including the same.

According to embodiments of the disclosure, there may be provided a thin film transistor array substrate occupying a reduced area and enhanced current characteristics and an electronic device including the same.

According to embodiments of the disclosure, there may be provided a thin film transistor array substrate including a vertical-structure transistor capable of element miniaturization and a short channel as well as excellent processing convenience, and an electronic device including the same.

The above-described embodiments are merely examples, and it will be appreciated by one of ordinary skill in the art various changes may be made thereto without departing from the scope of the present disclosure. Accordingly, the embodiments set forth herein are provided for illustrative purposes, but not to limit the scope of the present disclosure, and should be appreciated that the scope of the present disclosure is not limited by the embodiments. The scope of the present disclosure should be construed by the following claims, and all technical spirits within equivalents thereof should be interpreted to belong to the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device, comprising:
  a panel including at least one thin film transistor; and
  a driving circuit coupled to and driving the panel, wherein the panel includes:
    a substrate;
    a first electrode disposed on the substrate;
    a first insulation film disposed on the first electrode;
    a hole within the first insulation film, the hole exposing a portion of an upper surface of the first electrode;
    an active layer contacting a portion of an upper surface of the first insulation film and the portion of the upper surface of the first electrode;
    a second insulation film disposed on the active layer;
    a gate electrode disposed on the second insulation film;
    a third insulation film disposed on the gate electrode; and
    a second electrode and a third electrode disposed on the third insulation film, the second electrode and the third electrode being spaced apart from each other and electrically connected to the active layer,
  wherein the active layer includes a first channel area and a second channel area spaced apart from each other, and
  wherein the first channel area and the second channel area include an area positioned on a side surface of the hole of the first insulation film.

2. The electronic device according to claim 1, wherein the active layer is an oxide semiconductor.

3. The electronic device of claim 1, wherein the active layer includes:
  a first area and a second area disposed on the portion of the upper surface of the first insulation film and spaced apart from each other; and
  a third area disposed between the first area and the second area and disposed on the portion of the upper surface of the first insulation film, the side surface of the hole of the first insulation film, and the first electrode in the hole.

4. The electronic device of claim 3, wherein the gate electrode overlaps the third area of the active layer.

5. The electronic device of claim 3, wherein the second electrode contacts the first area of the active layer, and the third electrode contacts the second area of the active layer.

6. The electronic device of claim 3, wherein the third area includes the first channel area and the second channel area spaced apart from each other.

7. The electronic device of claim 6, wherein the first channel area extends from the first area of the active layer and is disposed on the portion of the upper surface of the first insulation film, is disposed on a portion of the side surface of the hole of the first insulation film, and is disposed on the portion of the upper surface of the first electrode overlapping the hole.

8. The electronic device of claim 6, wherein the second channel area extends from the second area of the active layer and is disposed on the portion of the upper surface of the first insulation film, is disposed on a portion of the side surface of the hole of the first insulation film, and is disposed on the portion of the upper surface of the first electrode overlapping the hole.

9. The electronic device of claim 6, wherein a length of the first channel area and a length of the second channel area are directly proportional to a height of the first insulation film.

10. The electronic device of claim 6, wherein when the transistor including the active layer is in an on state, the third area includes a connecting portion positioned between the first channel area and the second channel area, and
  wherein a resistance of the connecting portion is higher than a resistance of the first channel area and the second channel area.

11. The electronic device of claim 3, wherein the first electrode includes at least one recess, and
  wherein a portion of the recess of the first electrode overlaps the entire hole of the first insulation film.

12. The electronic device of claim 11, wherein a length of the first channel area and a length of the second channel area are directly proportional to a height of the recess of the first electrode.

13. The electronic device of claim 1, wherein the active layer includes a first active layer disposed on the portion of the upper surface of the first insulation film and a portion of the hole and a second active layer disposed on another portion of the upper surface of the first insulation film and a remaining portion of the hole.

14. The electronic device of claim 13, wherein the first active layer includes:
  a first portion which is an area where $N^+$ impurity ions are implanted;
  a second portion spaced apart from the first portion and disposed on the portion of the upper surface of the first electrode in the hole of the first insulation film; and
  a third portion disposed between the first portion and the second portion and including a portion disposed on an area not overlapping the hole of the first insulation film, a portion disposed on an area overlapping the side surface of the hole of the first insulation film, and a portion disposed on upper surface of the first electrode in the hole of the first insulation film.

15. The electronic device of claim 14, wherein the third portion of the first active layer is a channel area of the first active layer, and
  wherein a length of the third portion is directly proportional to a height of the hole of the first insulation film.

16. The electronic device of claim 13, wherein the second active layer includes:
  a fourth portion which is an area where $P^+$ impurity ions are implanted;
  a fifth portion spaced apart from the fourth portion and disposed on the portion of the upper surface of the first electrode in the hole of the first insulation film; and
  a sixth portion disposed between the fourth portion and the fifth portion and including a portion disposed on an area not overlapping the hole of the first insulation film, a portion disposed on an area overlapping the side surface of the hole of the first insulation film, and a portion disposed on the upper surface of the first electrode in the hole of the first insulation film.

17. The electronic device of claim 16, wherein the sixth portion of the second active layer is a channel area of the second active layer, and
wherein a length of the sixth portion is proportional to a height of the hole of the first insulation film.

18. The electronic device of claim 13, wherein in the hole of the first insulation film, a portion of the first active layer overlaps a portion of the second active layer.

19. The electronic device of claim 1, wherein the first electrode is a source electrode, and the second electrode and the third electrode are drain electrodes.

20. The electronic device of claim 1, wherein a same signal is applied to the second electrode and the third electrode.

21. The electronic device of claim 1, wherein different signals are applied to the second electrode and the third electrode.

22. The electronic device of claim 1, wherein a width of the first electrode is larger than a width of the active layer.

23. A thin film transistor assembly, comprising:
a first electrode on a substrate, the first electrode having a first surface;
a first insulation film on the first surface of the first electrode;
a hole extending through the first insulation film and exposing the first surface of the first electrode;
an active layer on the first insulation film and on the hole, the active layer contacting the first surface of the first electrode at the hole;
a second insulation film on the active layer;
a gate electrode on the second insulation film;
a second electrode on the active layer, the second electrode extending through the second insulation film to electrically connect to the active layer; and
a third electrode on the active layer, the third electrode spaced apart from and opposite the second electrode, the third electrode extending through the second insulation film to electrically connect to the active layer
wherein the active layer includes a first channel area and a second channel area spaced apart from each other, and
wherein the first channel area and the second channel area include an area positioned on a side surface of the hole of the first insulation film.

24. The thin film transistor assembly of claim 23, wherein the first insulation film has a first inclined surface formed by the hole extending through the first insulation film, and a second surface,
wherein the second surface of the first insulation film is a surface opposite to a surface of the first insulation film disposed on the first surface of the first electrode, and
wherein the active layer extends from the first surface of the first electrode at the hole to the first inclined surface of the first insulation film and at least partially overlaps the second surface of the first insulation film.

25. The thin film transistor assembly of claim 24, wherein the second electrode overlaps a portion of the active layer that at least partially overlaps the second surface of the first insulation film.

26. The thin film transistor assembly of claim 24, wherein the first insulation film has a second inclined surface opposite the first inclined surface formed by the hole extending through the first insulation film, and a third surface
wherein the third surface of the first insulation film is a surface opposite to a surface of the first insulation film disposed on the first surface of the first electrode, and
wherein the active layer extends from the first surface of the first electrode at the hole to the second inclined surface of the first insulation film and at least partially overlaps the third surface of the first insulation film.

27. The thin film transistor assembly of claim 26, wherein the third electrode overlaps a portion of the active layer that at least partially overlaps the third surface of the first insulation film, and
wherein the second surface of the first insulation film and the third surface of the first insulation film are spaced apart from each other and are coplanar with each other.

28. The thin film transistor assembly of claim 26, wherein the first electrode includes a second surface adjacent to the first surface, the first surface of the first electrode being in a recess portion of the first electrode, and an inclined surface between the first surface and the second surface, and
wherein a width of the hole extending through the first insulation film is smaller than a width of the recess portion.

29. The thin film transistor assembly of claim 28, wherein the active layer, the second insulation film, and the gate electrode each include a recessed portion at a corresponding location of the recess portion of the first electrode.

30. An electronic device, comprising:
at least one thin film transistor, the at least one thin film transistor including:
a first electrode on a substrate, the first electrode having a first surface;
a first insulation film on the first surface of the first electrode;
a hole extending through the first insulation film and exposing the first surface of the first electrode;
an active layer on the first insulation film and on the hole, the active layer contacting the first surface of the first electrode at the hole;
a second insulation film on the active layer;
a gate electrode on the second insulation film;
a second electrode on the active layer, the second electrode extending through the second insulation film to electrically connect to the active layer; and
a third electrode on the active layer, the third electrode spaced apart from and opposite the second electrode, the third electrode extending through the second insulation film to electrically connect to the active layer, and
a third insulation film on the gate electrode,
wherein the second electrode and the third electrode are on the third insulation film,
wherein the second electrode extends through the third insulation film and the second insulation film to electrically connect to the active layer, and
wherein the third electrode extends through the third insulation film and the second insulation film to electrically connect to the active layer.

* * * * *